United States Patent [19]

Yoshida et al.

[11] Patent Number: 4,816,885

[45] Date of Patent: Mar. 28, 1989

[54] THIN-FILM TRANSISTOR MATRIX FOR LIQUID CRYSTAL DISPLAY

[75] Inventors: Mamoru Yoshida; Tsutomu Nomoto; Tomoo Araki; Tsukasa Watanabe, all of Tokyo, Japan

[73] Assignee: Oki Electric Industry Co., Ltd., Tokyo, Japan

[21] Appl. No.: 47,130

[22] Filed: May 8, 1987

[30] Foreign Application Priority Data

May 14, 1986 [JP] Japan .................................. 61-110087

[51] Int. Cl.$^4$ ............................................ H01L 29/78
[52] U.S. Cl. ........................................ 357/23.7; 357/17; 357/45; 350/335; 350/336; 350/339 R; 350/342
[58] Field of Search ................. 357/23.7, 45, 17, 31, 357/32, 30 H, 30 K, 30 G, 30 S; 350/336, 335, 342, 339 R

[56] References Cited

U.S. PATENT DOCUMENTS

| | | | |
|---|---|---|---|
| 3,493,812 | 2/1970 | Weimer | 357/23.7 X |
| 3,974,515 | 8/1976 | Ipri et al. | 357/23.7 |
| 4,431,271 | 2/1984 | Okubo | 357/23.7 X |
| 4,582,395 | 4/1986 | Morozumi | 357/23.7 X |
| 4,697,331 | 10/1987 | Bouzitrop et al. | 350/336 X |
| 4,704,002 | 11/1987 | Kikuchi et al. | 357/23.7 X |

FOREIGN PATENT DOCUMENTS 2700365  6/1978  Fed. Rep. of Germany ...... 350/336

OTHER PUBLICATIONS

Yamano et al., *Journal of the Television Institute of Japan,* vol. 38, No. 4, (1984), pp. 336–370, "a-Si TFT Active-Matrix Full Color LC TV".

*Primary Examiner*—William D. Larkins
*Assistant Examiner*—William A. Mintel
*Attorney, Agent, or Firm*—Spencer & Frank

[57] ABSTRACT

A thin-film transistor matrix comprises thin-film transistors formed on a dielectric substrate and arranged in rows and columns. Each of the transistors comprises a control electrode, an insulation film formed on the control electrode, a semiconductor film formed on the insulation film, a first main electrode formed on the semiconductor film, and a second main electrode formed on the semiconductor film. Row interconnection layers are provided for the respective rows to interconnect the control electrodes of the transistors of the respective rows. Column interconnection layers are provided for the respective columns to interconnect the first main electrodes in the respective columns. The insulation film and the semiconductor film are formed in the regions where the transistor is formed and in the regions where the column interconnection layer is formed.

9 Claims, 6 Drawing Sheets

FIG.1

PRIOR ART

FIG.2

PRIOR ART

FIG.7 ions, an isolation film, a semiconductor

THIN-FILM TRANSISTOR MATRIX FOR LIQUID CRYSTAL DISPLAY

BACKGROUND OF THE INVENTION

This invention relates to a thin-film transistor matrix comprising a plurality of thin-film transistors arranged in a matrix array on a common dielectric substrate.

Matrix arrays of thin-film transistors on a common dielectric substrate are used in liquid-crystal displays and other devices. In the following description of a thin-film transistor matrix, the device exemplified is a liquid-crystal display.

A liquid-crystal display operates by using the thin-film transistor in a thin-film transistor matrix to switch individual liquid-crystal pixels directly. An explanation of this operation is given in the Journal of the Television Institute of Japan, Vol. 38 No. 4 (1984), pp. 366-370.

Figure 1:
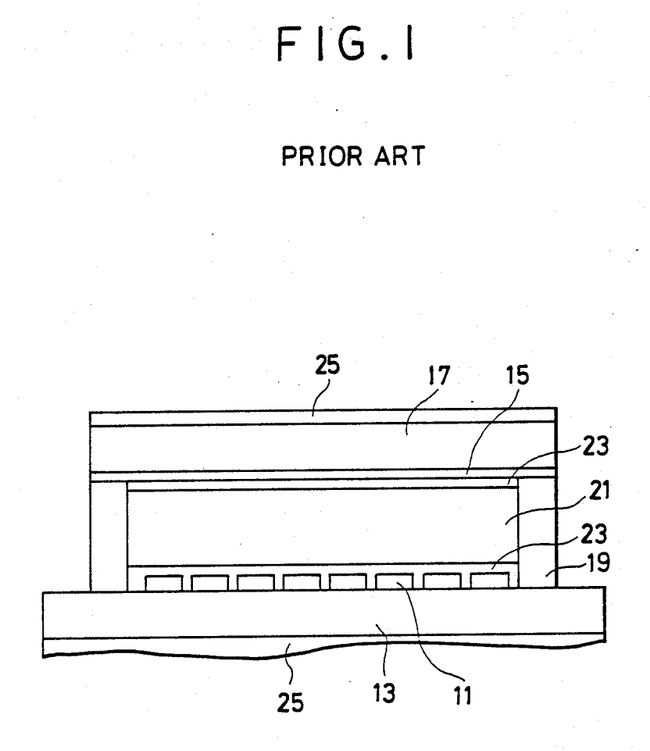
FIG. 1 is a cross-sectional view showing the structure of a liquid-crystal display.

FIG. 1 is a cross-sectional view showing the structure of a liquid-crystal display device as described in the reference cited above.

The liquid-crystal display comprises, on one side, a first dielectric substrate 13 on which a matrix array of thin-film transistors (not shown) are connected to a plurality of display electrodes 11, and on the other side an opposing electrode 15 mounted on a second dielectric substrate 17. The two substrates are separated by a certain gap. A sealing compound 19 holds the two substrates together at their edges, and the gap between them is filled with an injected liquid crystal 21. There are further provided a pair of orienting films 23 and a polarizer 25. The first dielectric substrate 13, supporting the matrix of thin-film transistor in this liquid-crystal display device, is referred to as the thin-film transistor matrix substrate.

Figure 2:
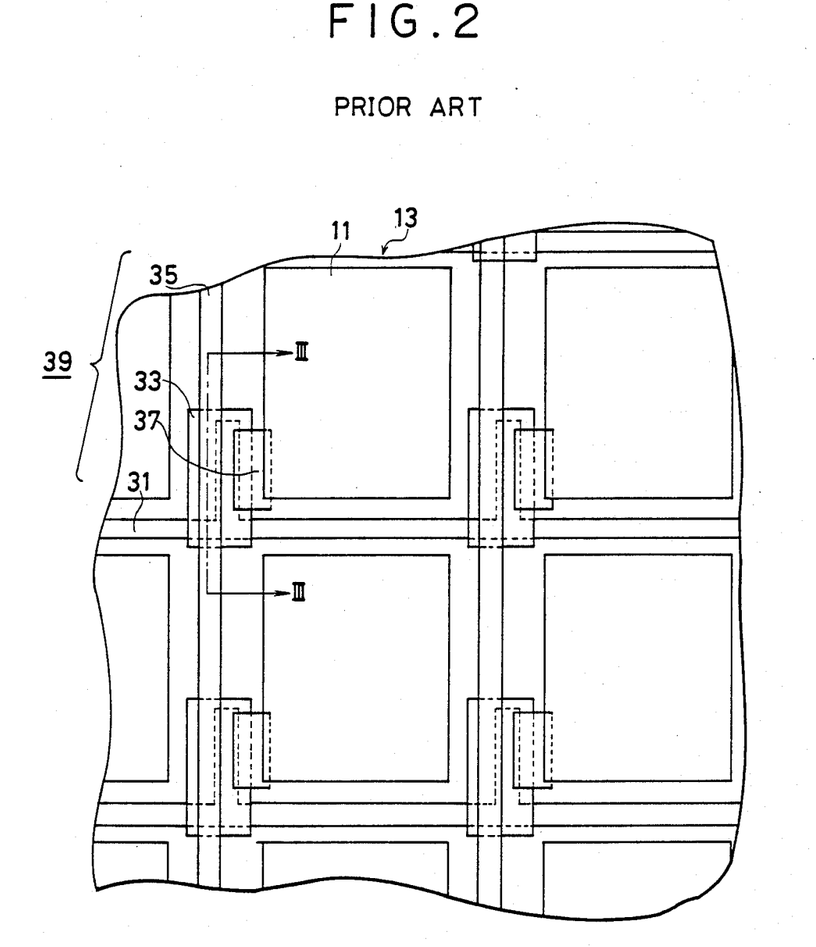
FIG. 2 is a plan view showing part of the thin-film transistor matrix substrate.

FIG. 2 shows an enlarged plan view of part of this first dielectric substrate 13 seen from the direction of the second dielectric substrate 17.

Figure 3A:
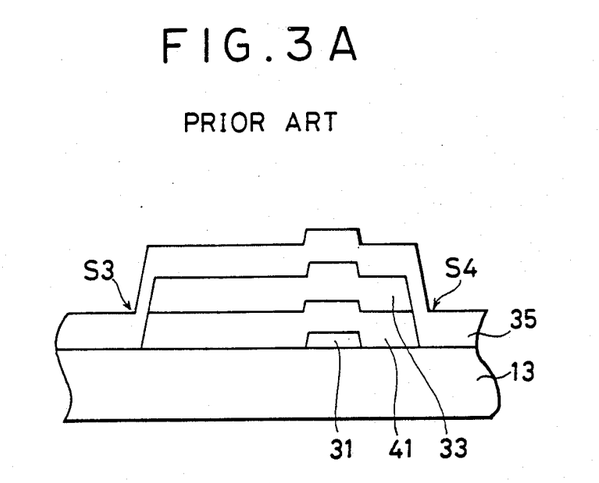
FIG. 3A and FIG. 3B are cross-sectional views through the line III—III in FIG. 2.

FIG. 3A is a cross-sectional view through the line III—III in FIG. 2.

As shown in FIGS. 2 and/or 3A, arranged on the first dielectric substrate 13 are a matrix of thin-film transistors 39 each comprising a gate electrode 31 that acts as a control electrode, a gate insulation film 41 that provides electrical isolation, an amorphous silicon film 33 that acts as a semiconductor film, and a drain electrode 35 (the first electrode) and a source electrode 37 (the second electrode) which are attached to the surface of the semiconductor film 33. Also shown in FIG. 2 are several display electrodes 11, each of which is connected via the source electrode 37 to its thin-film transistor 39. The gate electrodes 31 of the thin-film transistor 39 in each row (extending horizontally as viewed in FIG. 2) of the matrix array are interconnected, and the drain electrodes 35 in each column (extending vertically as viewed in FIG. 2) are interconnected.

A brief description will now be given of the fabrication process of the above structure on the first dielectric substrate 13. The gate electrodes 31 which act as the control electrodes are formed on a transparent dielectric substrate, such as a glass substrate, interconnected in each row as described above. On this dielectric substrate 13, which includes the gate electrodes 31, are formed first a gate insulation film 41 and then an amorphous silicon film 33. Partial removal of these films leaves a pattern of islands with a layered structure, the layers being the gate insulation film 41 and semiconductor film 33.

Next a metalization process is performed using aluminum, for example, to create the drain electrodes 35 and the source electrodes 37. The drain electrodes 35 in each column are interconnected with each other but are electrically isolated from the source electrodes 37. Finally the display electrodes 11 in the form of a transparent conductive film are formed and a passivation layer (not shown) is applied over the entire dielectric substrate 13, including the display electrodes 11 and thin-film transistors 39, to complete the thin-film transistor matrix.

In the thin-film transistor matrix described above, since the drain electrodes 35 are interconnected in each column and are formed over the layered structure of the island configuration, they must cross a vertical step between the surface of the layered islands of the gate isolation film 41 and the amorphous silicon film 33 and the surface of the insulating substrate 13. More specifically, each of the drain electrodes 35 ascends the step S3 from the dielectric substrate 13 to the surface of the amorphous silicon film 33, then descends the step S4 back to the surface of the dielectric substrate 13.

Figure 3B:
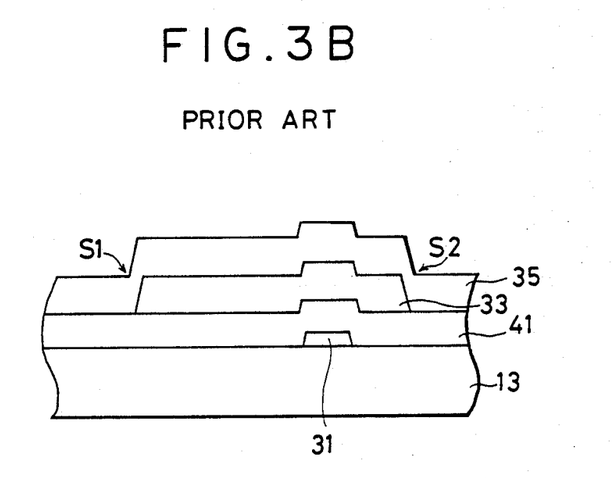

As an alternative to the configuration shown in FIG. 3A, in which the gate insulation film 41 is confined to the thin-film transistor region, the gate insulation film 41 may be made to extend over the dielectric substrate 13 outside the region of the thin-film transistor 39, as shown in FIG. 3B, which also shows a cross-section through the line III—III in FIG. 2. In this case, each of the drain electrodes 35 ascends the stop S1 from the surface of the gate insulation film 41 to the surface of the amorphous silicon film 33 then descends the step S2 back to the surface of the gate insulation film 41.

Liquid crystal display devices using the thin-film transistor matrix structure of the prior art have suffered from the problem of discontinuities in the drain electrodes at the locations of steps S1, S2, S3, and S4 when step coverage of the drain electrode metal is inadequate.

If the liquid-crystal display device has 640×400 pixels, for instance, there are 640×400×2=512,000 step locations as described above. A discontinuity at any one of these steps makes the liquid-crystal display defective due to one or more nonfunctioning pixels. To avoid the fabrication of defective devices, the probability of a discontinuity at a step must be held to a value well below about 1/500,000. In a thin-film transistor matrix with the structure of the prior art, keeping the probability of a discontinuity at a step (S1, S2, S3, S4 or the like) at such a low level is extremely difficult.

SUMMARY OF THE INVENTION

An object of the invention is to solve the above problem.

Another object of the invention is to provide a thin-film transistor matrix in which all of the thin-film transistors are functional.

A further object of the invention is to enable high-yield fabrication of liquid-crystal display devices without display defects.

To achieve the above objects, a thin-film transistor matrix according to the invention comprises a dielectric substrate, on which are created in turn a plurality of control electrodes, an isolation film, a semiconductor film, and first and second main electrodes formed on the semiconductor film, the control electrodes being interconnected in each row and the first main electrodes being interconnected in each column, characterized in that the insulation film and the semiconductor film are formed not only in the regions of the transistors but also in the regions of the column interconnections, whereby the column interconnections are located to extend on the surface without vertical steps, e.g., on the surface of a layered region created in the same process that creates the insulation film and semiconductor film on the dielectric substrate.

In the configuration described above, formed between the dielectric substrate and the column interconnections, is a layered structure having a substantially continuous surface throughout the respective columns. In other words, the surface of this layered structure is free from vertical steps that might cause electrical discontinuities in the column interconnections. Thus, it is possible to eliminate the problem of discontinuities in the column interconnections of the first electrodes of the thin-film transistor matrix due to inadequate coverage of vertical steps.

BRIEF DESCRIPTION OF THE DRAWINGS

In the accompanying drawings:-

DETAILED DESCRIPTION OF THE PREFERRED EMBODIMENTS

Embodiments of the invention will now be described with reference to the drawings. The drawings show only those features necessary to explain the unique features of the invention, and it should be understood that the component dimensions, shapes, and layout are not restricted to the examples shown. Identical components in different drawings are indicated by identical numbers. Components identical to those in the depiction of the prior art are also indicated by identical numbers, and detailed descriptions of these components are omitted.

Figure 4:
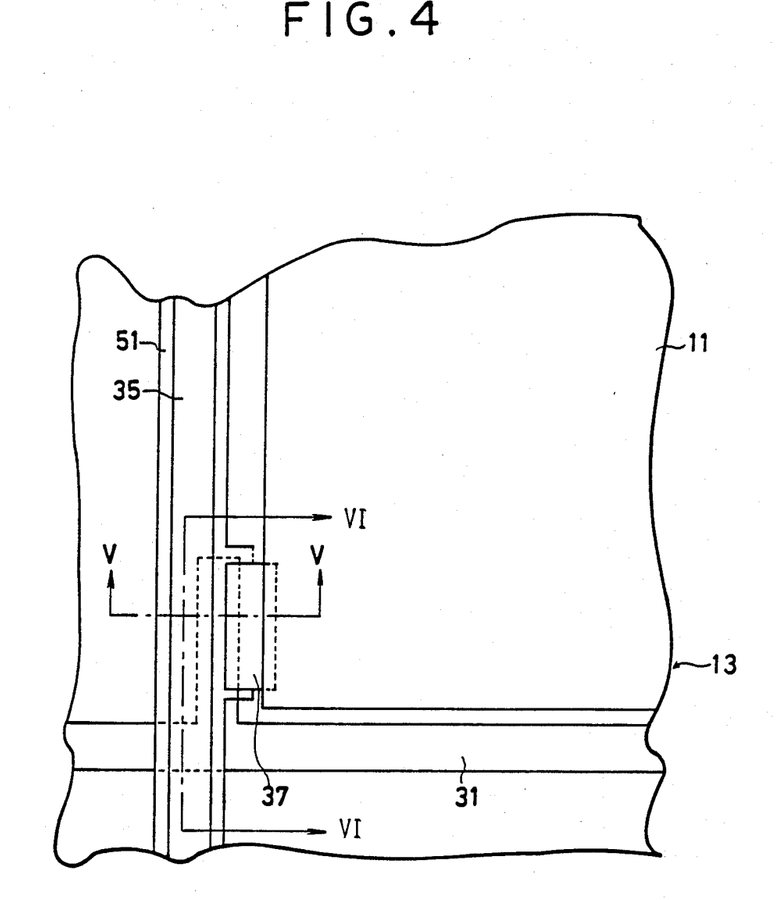
FIG. 4 is a plan view showing a part of a thin-film transistor matrix according to an embodiment of the invention.
Figure 5:
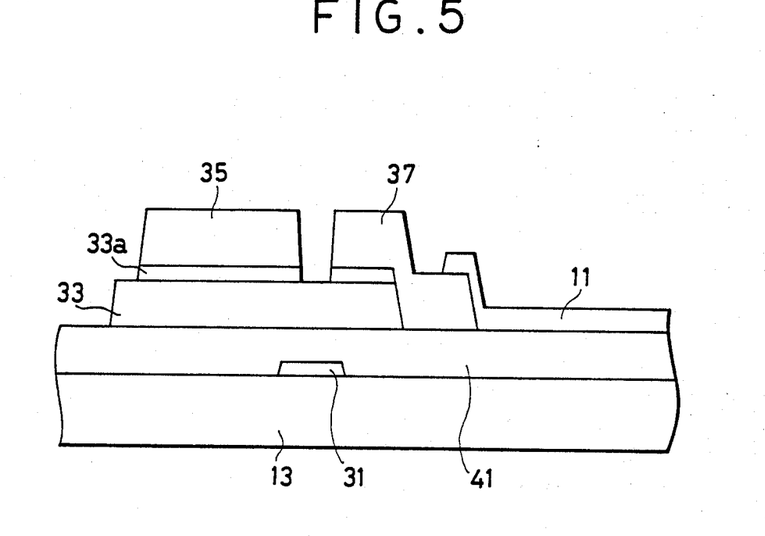
FIG. 5 is a cross-sectional view through the line V—V in FIG. 4.
Figure 6:
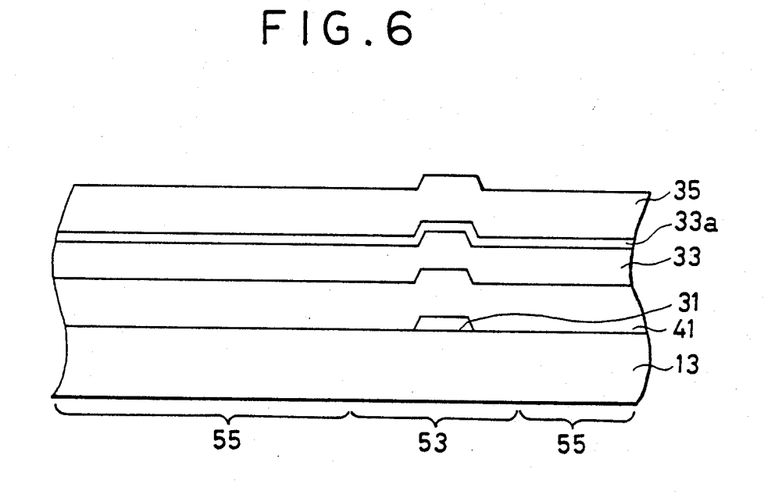
FIG. 6 is a cross-sectional view through the line VI—VI in FIG. 4.

FIGS. 4, 5 and 6 show one embodiment of this invention which is a thin-film transistor matrix. FIG. 4 is a plan view of part of the thin-film transistor matrix, showing the area around one of the thin-film transistors on the dielectric substrate 13. FIG. 5 is a cross-sectional view through the line V—V in FIG. 4, and FIG. 6 is a cross-sectional view through the line VI—VI in FIG. 4.

The thin-film transistor which is formed in the region 53 (FIG. 4 and FIG. 6) comprises a gate electrode film 31 formed on the dielectric substrate 13 to act as the control electrode and interconnected with the gate electrodes of all of the thin-film transistors in the same row of the matrix array. (Only one thin-film transistor is shown in this drawing.) In this embodiment of the invention the dielectric substrate 13 and the gate electrodes 31 are entirely covered by a gate insulation film 41 for electrical insulation. An amorphous silicon film 33 is deposited as a semiconductor film in the regions 53 in which the thin-film transistors are formed and in the regions 55 in which column interconnections of their first electrodes are formed. The gate insulation film 41 and the amorphous silicon film 33 and an N+ amorphous silicon film 33a on the amorphous silicon film 33 in these regions thus create a layered structure 51. On this layered structure 51, extending over part of the thin-film transistor region 53 and part of the column interconnection region 55, interconnection layer 35 is created. Parts of the column interconnection layer that are within the regions for the transistors constitute the first or drain electrod 35. Electrically isolated from the drain electrode 35, a source electrode 37 is created in the thin-film transistor region of the layered structure 51 as the second electrode. The source electrode 37 connects the thin-film transistor to the display electrode 11 as in the prior art.

In a thin-film transistor matrix with this configuration, the layered structure consisting of the gate insulation film 41, the amorphous silicon film 33, and the N+ amorphous silicon film 33a also extend over the thin-film transistor region 53, as well as the region 55 of the drain electrode interconnections to other thin-film transistors (not shown) in the same column. Accordingly, the surface of the layered structure crossed by the drain electrode 35 is free from vertical steps that might cause electrical discontinuitites. The electrical discontinuities at vertial steps that were a problem in the prior art therefore do not occur.

In this invention it is of course possible for the first-electrode interconnections in each column to include an interconnection with components situated at the end of the column, such as an integrated driver circuit for the thin-film transistors.

The fabrication process of the above thin-film transistor matrix will be explained.

The gate electrodes 31 of a thin film of a metal, such as chromium (Cr), nichrome (NiCr), gold (Au), molybdenum (Mo), tantalum, (Ta), or titanium (Ti) are created on the surface of a dielectric substrate 13 of a material such as glass. On this dielectric substrate 13, including the gate electrodes 31, is next deposited, by a method such as plasma chemical vapor deposition (CVD), a gate insulation film 41 of a material, such as silicon nitride or silicon oxide, with a thickness in the range of, say, 0.1 to 1.0 micrometers. The plasma CVD method is next used to deposit an amorphous silicon film 33 with a thickness of, say, 0.02 to 0.5 micrometers as a semiconductor layer over the gate isolation film 41, and a film 33a of N+ amorphous silicon doped with phosphorus (P) as an ohmic contact layer. Then photoetching is carried out to leave the amorphous silicon layers 33 and 33a in the regions 53 and 55 where the thin-film transistors and their common drain-electrode interconnections will be formed.

Next a layer 35, 37 of a metal such as aluminum, molybdenum, nickel, chrome, or gold is formed with a thickness of, say, 0.1 to 5 micrometers and processed to leave the pattern required to create the drain electrodes 35 on the N+ amorphous silicon film and the source electroles 37 on the N+ amorphous silicon film 33a and the gate insulation film 41. The drain electrodes 35 and the source electrodes 37 are then used as a mask and the unmasked portions of the N+ amorphous silicon film 33a are removed by an etching process.

The display electrodes 11 in the form of transparent conductive film, such as ITO or SnO$_2$, are next created in regions connected to the source electrodes 37. Finally a passivation layer (not shown) is applied over the dielectric substrate 13 and the display electrodes 11, thin-film transistors, and other components that have been created on it, and a light mask of a material, such as a metal, is created on the part of the passivation layer which overlies the gate electrodes 31.

In this way a thin-film transistor matrix suitable for use in a liquid-crystal display device can be fabricated.

Figure 7:
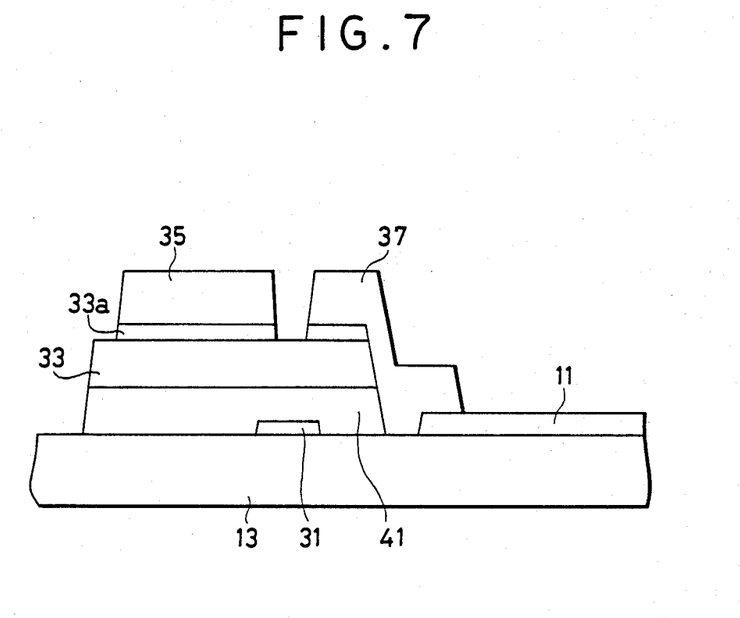
FIG. 7 is a cross-sectional view through the line V—V in FIG. 4 showing another embodiment of the invention.

FIG. 7 shows a thin-film transistor matrix according to a second embodiment of this invention. The view shown is a cross-section through the line V—V in FIG. 4.

The components of the thin-film transistor matrix in this embodiment are the same as the components in the first embodiment, but the gate insulation film 41 is left only in the region 53 in which the thin-film transistor is formed and the region 55 in which the column interconnections of the drain electrodes 35 is formed, and is not provided to cover the region of the display electrode 11. The drain electrodes 35 are created in the necessary locations on the layered structure 51 formed by this gate insulation film 41 and the semiconductor films 33 and 33a. In this configuration also, there are no vertical steps that might cause electrical discontinuities in the drain electrodes 35.

The structure of the connection between the display electrode 11 and the source electrode 37 that forms the second electrode in this embodiment differs from that in the first embodiment, but the purpose of the invention is clearly fulfilled despite the different connecting structure.

The fabrication process for the second embodiment above is slightly different from the fabricated process for the first embodiment. For example, a patterning step must be added to give the gate insulation film 41 the necessary form, and the display electrodes 11 must be created before the metalization step for the drain electrodes 35 and source electrodes 37.

The embodiment of FIGS. 4 to 6 can be modified to have the structure of connection with the display electrode 11 that is shown in FIG. 7. Similarly, the embodiment of FIG. 7 can be modified to have the structure of connection with the display electrode 11 that is shown in FIG. 5.

The shape (plane shape as viewed from above) of the layered structure on which the drain electrodes are formed can be altered from those shown in the embodiments above to adapt to a specific design of the thin-film transistors, the display electrodes, etc.

The scope of this invention is not restricted to the thin-film transistor matrixs in the embodiments described above.

The embodiments above were examples given to show the application of the thin-film transistor matrix of this invention in a liquid-crystal display device. This invention can be applied to other display devices in which the driving elements can be thin-film transistors, such as electroluminescent displays with an active matrix drive.

This invention can also be applied to a two-dimensional image sensor driven by a thin-film transistor matrix.

The semiconductor film in the above embodiments was described as consisting of amorphous silicon, but it could consist of other substances instead, such as an amorphous silicon compound, polycrystalline silicon, or CdSe.

As is clear from the description above, in the configuration of the thin-film transistor matrix of this invention the insulation film 41 and the semiconductor films 33, 33a of the thin-film transistor regions 53 of the matrix continue into the regions 55 for the drain electrode interconnections, forming a layered structure under the interconnection paths. The surface of this layered structure is free from vertical steps that might cause electrical discontinuities in the drain electrode lines. This invention can accordingly prevent discontinuities due to inadequate step coverage of the underlying step portions in the formation of the drain electrodes interconnected in each column of the thin-film transistors matrix array.

This invention can therefore provide a thin-film transistor matrix in which all of the thin-film transistors can be driven in any desired way.

Accordingly, this invention will enable high-yield production of liquid-crystal display devices without display defects.

The thin-film transistor matrix of this invention can be fabricated by the same process as used in the prior art with simple alterations of the photoetching mask patterns so that, from the view point of production cost as well, this invention has a high industrial value.

What is claimed is:

1. A thin-film transistor matrix, comprising:
   a plurality of thin-film transistors formed on a dielectric substrate and arranged in rows and columns to form a matrix array, each of the transistor comprising
   a control electrode,
   an insulation film formed on the control electrode,
   a semiconductor film formed on the insulation film,
   a first main electrode formed on the semiconductor
   a second main electrode formed on the semiconductor film,
   the matrix further comprising
   a plurality of display electrodes provided in association with respective thin-film transistors and adjacent thereto
   row interconnection layers provided for the respective rows and interconnecting the control electrodes of the transistors of the respective rows, and
   column interconnection layers provided for the respective columns and interconnecting the first main electrodes in the respective columns,
   wherein the insulation film and the semiconductor film are formed in each of the regions where the transistor is formed and in each of the regions where the column interconnection layer is formed, and do not cover the display electrodes.

2. The thin-film transistor matrix according to claim 1, wherein the insulation film is formed to cover the control electrodes and row interconnection layers.

3. The thin-film transistor matrix according to claim 1, wherein the insulation film and the semiconductor film are substantially continuous throughout each column.

4. The thin-film transistor matrix according to claim 1, wherein the control electrodes are formed of the same material and during the same process step as the row interconnection layers.

5. The thin-film transistor matrix according to claim 1, wherein the first main electrodes are continuous with and formed of the same material and during the same process step as the column interconnection layers.

6. The thin-film transistor matrix according to claim 1, wherein the column interconnection layers extend throughout the respective columns and parts of the column interconnection layers that are within the regions of the first main electrodes.

7. The thin-film transistor matrix according to claim 1, wherein the second main electrodes are connected to the respective display electrodes.

8. The thin-film transistor matrix according to claim 7, wherein each of the display electrodes is formed in a substantially rectangular region defined by two adjacent column interconnection layers and two adjacent row interconnection layers.

9. The thin-film transistor according to claim 1, wherein the semiconductor film on which the first main electrode is formed has a surface which receives the first main electrode and which is substantially planar and free from vertical steps.

* * * * *